US006097325A

United States Patent [19]

Roza

[11] Patent Number: 6,097,325

[45] Date of Patent: Aug. 1, 2000

[54] SYNCHRONOUS SIGMA DELTA MODULATOR INCLUDING A DECISION CIRCUIT USING A POLYPHASE SAMPLER

[75] Inventor: Engel Roza, Eindhoven, Netherlands

[73] Assignee: U.S. Philips Corporation, New York, N.Y.

[21] Appl. No.: 09/060,085

[22] Filed: Apr. 14, 1998

[30] Foreign Application Priority Data

Apr. 16, 1997 [EP] European Pat. Off. .............. 97201127

[51] Int. Cl.[7] .............................. H03M 3/00; H03M 1/12

[52] U.S. Cl. .............................................. 341/143; 341/155

[58] Field of Search ..................................... 341/155, 143, 341/139, 61, 70; 375/333

[56] References Cited

U.S. PATENT DOCUMENTS

| | | | |
|---|---|---|---|
| 4,926,178 | 5/1990 | Mallinson | 341/143 |
| 4,954,824 | 9/1990 | Yamada et al. | 341/61 |
| 5,055,846 | 10/1991 | Welland | 341/155 |
| 5,621,408 | 4/1997 | Cake et al. | 341/143 |
| 5,719,571 | 2/1998 | Akune et al. | 341/61 |

FOREIGN PATENT DOCUMENTS 2271905 4/1994 United Kingdom .

OTHER PUBLICATIONS

"A Unity Bit Coding Method by Negative Feedback", by H. Inose et al., Proceedings of the IEEE, Nov. 1963, pp. 1524–1535.

*Primary Examiner*—Brian Young
*Assistant Examiner*—Patrick Wamsley
*Attorney, Agent, or Firm*—Steven R. Biren

[57] ABSTRACT

The invention relates to a synchronous sigma-delta modulator with a feedback loop which comprises an integrating filter followed by a polyphase sampler generating a plurality of phase shifted samples and an adder to add the plurality of phase shifted samples and to feed the added samples back to the input of the integrating filter.

8 Claims, 1 Drawing Sheet

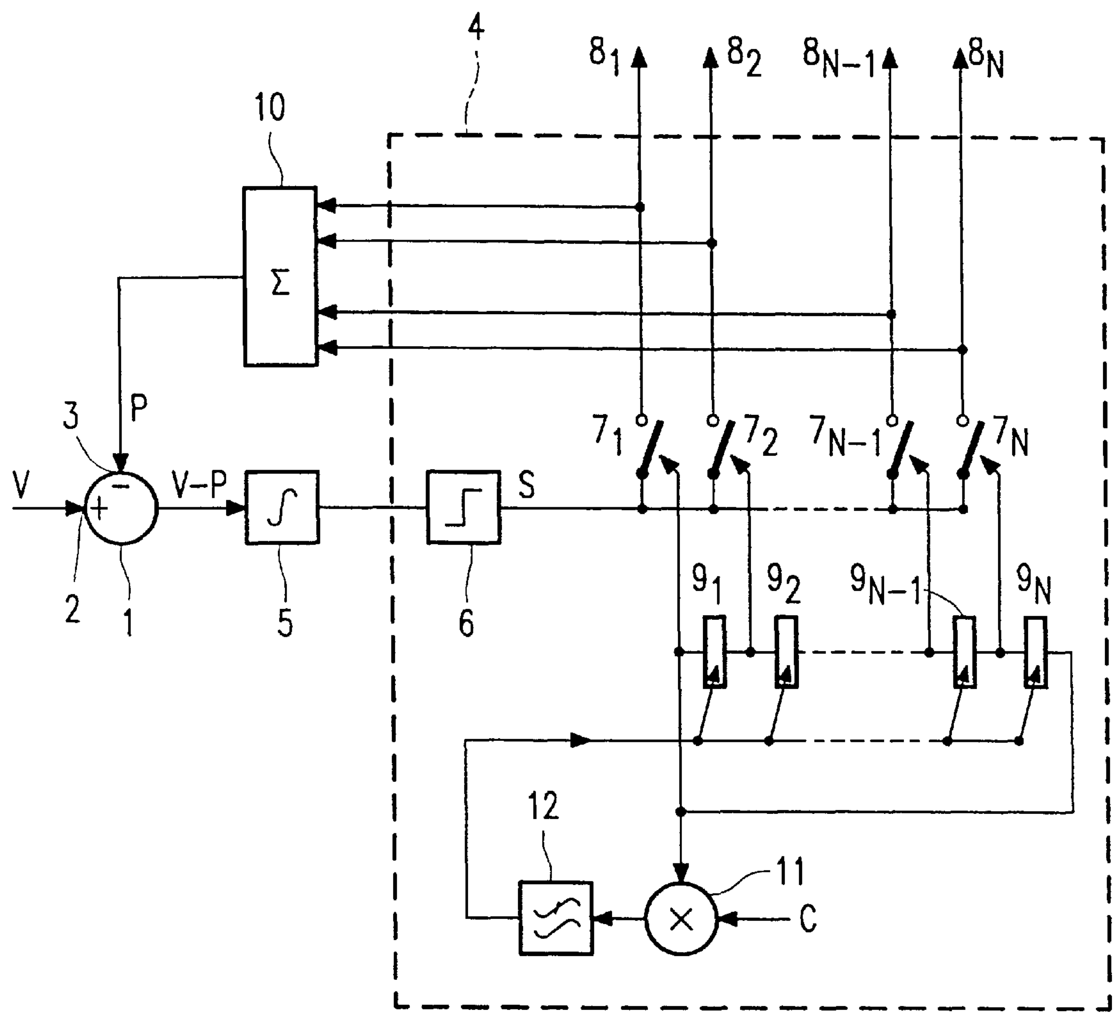
4
10
Σ
$8_1$
$8_2$
$8_{N-1}$
$8_N$
3
P
V
V−P
S
$7_1$
$7_2$
$7_{N-1}$
$7_N$
2
1
5
6
$9_1$
$9_2$
$9_{N-1}$
$9_N$
12
11
C

SYNCHRONOUS SIGMA DELTA MODULATOR INCLUDING A DECISION CIRCUIT USING A POLYPHASE SAMPLER

BACKGROUND OF THE INVENTION

This invention relates to a synchronous sigma-delta modulator for analog input signals comprising, in feedback arrangement, an integrating filter, a decision circuit for comparing output signals of the integrating filter with a reference level and for generating output pulses dependent on the result of the comparison at synchronously clocked instants, and means for feeding the output pulses of the decision circuit with the analog input signals to said integrating filter. Such synchronous sigma-delta modulators are well known in the art e.g. from the article "A Unity Bit Coding Method by Negative Feedback" by H. Inose et al. in "Proceedings of the IEEE" of November 1963, pp. 1524–1535, wherein the decision circuit is referred to as "pulse modulator".

Synchronous sigma-delta modulators are used as analog to digital converters in various signal processing applications. Because of the problems involved with higher frequencies, the practical use of these modulators has been substantially restricted to voice band and audio band applications. It is true, that the above mentioned article describes the use of synchronous sigma-delta modulators for the modulation of video signals, but therein the proposed sampling frequency at which the decision circuit is operated is not higher than 50 MHz, whereas sampling frequencies higher than 1 GHz are strongly preferred for high performance video applications (i.e. signal bandwidth>5 MHz and signal to noise ratio>60 db).

In practice the decision circuit is a clocked comparator, which has to perform a high-frequency non-linear operation on weak input signals and has to provide a sequence of identical return to zero pulses. If the pulses are not identical, noise is introduced in the modulator. With present day technology it is not well possible to design a decision switch which operates sufficiently noise free at the high clock-frequency needed. This is due to the fact that the decision switch is not sufficiently reset from the previous switching action. Therefore, the construction of a high precision sensitive high-frequency decision circuit is the major bottleneck in the construction of high-frequency synchronous sigma-delta modulators.

SUMMARY OF THE INVENTION

The present invention has for its object to considerably improve the synchronous sigma-delta modulation of broad-band signals, such as video signals, and the synchronous sigma-delta modulator of the present invention is therefore characterized in that said decision circuit comprises a polyphase sampler having a plurality of samplers for providing phase shifted output pulses and an adder for providing the sum of the phase shifted output pulses to the integrating filter. More particularly the present invention provides a synchronous sigma-delta modulator with a plurality of samplers, each of which performs a part of the sampling job, so that the clock frequency for each of the samplers may be substantially reduced giving each sampler ample time to reset from its previous switching action, while still a high effective sampling frequency is obtained. The output pulses of the samplers are subsequently added together in an adder, whereupon the combined output pulses are fed back to the input of the integrating filter.

As noted, the decision switch (sampler) of prior art synchronous sigma-delta modulators may be a clocked comparator, which performs both the comparison of the filter output signal with the reference signal and the switching action. For ease of description, the multiple sampling process of the present invention is conceived in this description as a single comparison (hard limiting) operation followed by a set of samplers operating at a high (digital) signal level. However, in order to avoid the additional delay introduced in the feedback loop by such common comparison operation, preferably a plurality of decision switches may be used each of which performs both the comparison operation and the switching action, where the hard limiting operation and the sampling operation are simultaneously performed by operating the decision former at a common weak analog signal.

The comparator compares the output signal of the integrating filter with the reference level and provides a square wave (limit cycle) which is subsequently sampled by the plurality of samplers of the polyphase sampler. For instance, the comparator provides a square wave having a positive value (+1) when the filter output signal is positive and an equal negative value (−1) when the filter output signal is negative with respect to the reference level. Usually, in prior art synchronous sigma-delta modulators the frequency of this limit cycle is pushed away to half the effective sampling frequency by out of band corrections of the integrating filter. However, at the higher frequencies which the present invention seeks to master, it is more difficult to make such corrections and therefore the synchronous sigma-delta modulator of the present invention may be further characterized in that the limit cycle frequency at zero input signal is substantially lower than the effective sampling frequency at which the polyphase sampler operates. This measure is based on the recognition that a lower frequency of the limit cycle, although it somewhat increases the signal to noise ratio of the modulator, is still well acceptable if properly chosen.

The polyphase sampler may comprise a string of delay cells for delivering a plurality of phase shifted sampling pulses to the plurality of samplers whereby the actual sampling operation takes place on the leading edge of the waveform. For ease of implementation, the actual waveforms in the sampling process may be "full T" pulses, thereby relaxing the requirements on high frequency operation which would occur in the case of sampling by narrow pulses. The pulse shape itself has minor spectral influence, which can be accounted for in the integrating filter. More important however is the delay time introduced by the effect of the width of the pulses, especially because, with a larger number of samplers, the duration of the "full T" output pulses, and consequently the delay introduced, will be larger. To mitigate the problems caused by this delay, the synchronous sigma-delta modulator according to the invention may be further characterized in that the width of the output pulses, supplied to the adder, is equal to one half of the period of these pulses ("½ T" pulses). This has been found to be a good compromise between lower delay, equality of the pulses and simplicity in the circuitry.

BRIEF DESCRIPTION OF THE INVENTION

The invention will now be described with reference to the accompanying single FIGURE which shows a preferred embodiment of a synchronous sigma-delta modulator in accordance with the present invention.

DESCRIPTION OF THE PREFERRED EMBODIMENTS

The synchronous sigma-delta modulator the FIGURE comprises a subtracter 1 with a first input terminal 2 to which an analog input signal v may be applied, and a second input terminal 3 to which an output signal p from an adder 10 is applied. The difference v−p from the subtracter is fed to an integrating filter 5 and the filtered difference signal is fed to a comparator 6 (hard limiter), which is part of the decision circuit 4. The decision circuit 4 further comprises a bank of N samplers $7_1 \ldots 7_N$. These samplers receive the output signal s of the comparator and deliver samples of the comparator output signal to a bank of output terminals $8_1 \ldots 8_N$.

The samplers $7_1 \ldots 7_N$ are controlled by the taps of a string of delay cells $9_1 \ldots 9_N$. The input of each delay cell $9_2 \ldots 9_N$ is connected to the output of the previous cell and the input of the first cell $9_1$ is connected to the output of the last cell $9_N$, so that the cells are configured in a ring. The ring of delay cells constitute a ring oscillator in which a sampling pulse can circulate. From each of the taps a sampling pulse can be obtained which is delayed with respect to the sampling pulse of the previous tap in the ring. Consequently, the samplers 7 and the delay cells 9 form a polyphase sampler, in which the samplers are activated in succession so that the comparator output signal s is sampled in succession by the samplers $7_1 \ldots 7_N$ and the output terminals $8_1 \ldots 8_N$ deliver N successive samples of the comparator output signal s. Of course, when the last sampler $7_N$ has been activated, the first sampler $7_1$ is again activated, and so on, so that a continuous sequence of N-bit words is generated at the output terminals $8_1 \ldots 8_N$. These N-bit words are preferably applied to a decimating digital filter (not shown in the figure) which transforms these N-bit words e.g. to 7- or 8-bits words in PCM-format.

The samples at the output terminals $8_1 \ldots 8_N$ are added in adder 10 and the so added samples constitute the output signal p which is fed back to the input terminal 3 of the subtracter 1.

In a phase detector 11, the phase of the sampling pulse at e.g. the first tap of the ring of delay cells is compared with the phase of a clock pulse c and the output signal of the phase detector 11 is, after passing a low pass filter 12, used to control the delay of the delay cells $9_1 \ldots 9_N$. In this way it is ascertained that the delay of the cells is always 1/Nth of the clock pulse period and the sampling pulses are locked to the clock frequency.

In operation, the comparator output signal s is a square wave between two values, e.g +1 and −1. Consequently the pulses at the output terminals 8 are pulses of value +1 or −1. When the analog input signal is zero (v=0), pulses of value +1 and pulses of value −1 appear equally frequently. However, when the input signal v increases, the number of +1 pulses increases and the number of −1 pulses decreases. Vice versa, when the input signal decreases, the number of +1 pulses decreases and the number of −1 pulses increases. The "density" of the output pulses of one value (e.g. +1) is approximately linearly proportional to the input signal v.

The samplers $7_1 \ldots 7_N$ operate in parallel. If $f_s$ is the effective sampling frequency of the synchronous sigma-delta modulator, the sampling frequency of each individual sampler is $f_s/N$. The time between two successive activations of a sampler is much longer $(N/f_s)$ than in case one single sampler would be used $(1/f_s)$, so that the risk that a sampler has not yet been recovered from the previous sampling operation when the next sampling pulse occurs, has been effectively reduced.

The pulses, generated by the samplers $7_1 \ldots 7_N$, can be made smaller than the period of the effective sampling rate $(1/f_s)$, so that a stream of return to zero pulses appears at the output of the adder 10. However this is not necessary. It is also possible to design the samplers $7_1 \ldots 7_N$ so that the width of the sample pulses at the outputs $8_1 \ldots 8_N$ is e.g. equal to the sampling period $(N/f_s)$ of the individual samplers. Such pulses are usually referred to as "full T pulses". Because then the width of the added pulses $(N/f_s)$ is greater than the phase shift $(1/f_s)$ between successive output pulses of the polyphase sampler, the signal p consists of a large number of each other overlapping pulses, so that a staircase-shaped signal p results. This staircase signal roughly follows the shape of the analog signal v.

The advantage of making the sampler pulses broader is the following. When the samplers generate sharp output pulses, whose width is fully determined by the samplers itself, then the generated sampler output pulses may differ due to the differences in the dimensioning of the respective samplers. These differences will contribute to the noise level of the signal generated by the synchronous sigma-delta modulator. Deliberately broadening the width of the sampler output pulses will reduce the influence of the individual samplers thereon, and therefore will reduce the noise. A further advantage may be that broadening the sample output pulses will increase the loop gain of the feedback loop. On the other hand, a disadvantage of wider sampler output pulses is that extra delay is introduced in the feedback loop and analysis of the operation of the arrangement shows that increasing the delay of the feedback loop has a detrimental effect on the sampling noise generated.

A good compromise is achieved if "half T pulses" are used, i.e. if the width of the output pulses of the samplers is (substantially) equal to one half of the sampling period $(f_s/N)$ of the samplers. It may be observed, that the generation of such "half T pulses" by the samplers can be done e.g. by designing the samplers so that they start generating the sampled value at the leading edge of the sampling pulse and stop generating this value (and returning to zero) at the trailing edge of the waveform of the ring oscillator.

The following example illustrates a preferred design of the proposed circuit. Suppose that it is desired to design an A/D converter for a bandwidth of 5 MHz. For optimum performance the clock rate $f_s/N$ has to be as high as possible. For ease of design the clock rate should be matched to the properties of the technology and the available design libraries in this technology. For the existing CMOS technology, a 54 MHz clock rate was used, because this clock rate is very suitable and allows to design a robust circuitry. The integrating filter 5 was of second order with unity d.c. gain, two coinciding poles of low frequency and a zero of 17 MHz. If "half T" pulses giving a delay $\tau=\frac{1}{4}*N/f_s\approx4.6$ ns, are fed back, it appears that a signal to noise ratio of 66 db is obtained with a bank of 32 samplers (N=32), which gives an effective sampling frequency $f_s$ of 32*54 MHz≈1.7 GHz.

As already noted in the introductory part of this application, in usual prior art synchronous sigma-delta modulators the square wave output signal (limit cycle) of the comparator 6 has a frequency at zero input signal which is one half of the effective sampling frequency, This means that each sampling pulse results in one edge of the square wave. In contradistinction herewith, the limit cycle frequency of the synchronous sigma-delta modulator of the present invention may preferably be much lower. When the hysteresis of the comparator is negligible small, this frequency is mainly determined by the delay τ and the zero of the filter 5. In the practical design example given above, this frequency, at zero input signal, is approximately equal to 36 MHz. This is higher than twice the highest input frequency (10 MHz), but substantially lower than one half the effective sampling frequency (850 MHz). This means that the polyphase sampler generates (at zero input signal) a package of about 24 samples of one value, followed by a package of about 24 samples of the other value, and so on.

Of course, when the comparator 6 is not present and its function is performed by each of the samplers $\mathbf{7}_1 \ldots \mathbf{7}_N$, which operate as combined comparator/decision switch, the limit cycle still exists intrinsically, although it cannot be easily indicated in the circuit arrangement. The intrinsic limit cycle frequency may be found by determining the contiguous periods during which leading edges of output pulses of one value occur.

In applicant's copending application (PHN . . . =GK 79891) it has already been remarked, that the effective sampling frequency of the polyphase sampler can be doubled by using delay cells with balanced outputs and halved delay, and doubling the number of samplers. This configuration may also be used in connection with the present invention.

What is claimed is:

1. A synchronous sigma-delta modulator for an analog input signal comprising:

an integrating filter;

a decision circuit including a plurality of samplers capable of providing phase shifted output pulses, wherein said decision circuit is arranged to compare a signal from said integrating filter with a reference level and to generate the phase shifted output pulses dependent on a comparison result at synchronously clocked instants;

an adder coupled to said decision circuit to determine a sum of the phase shifted output pulses; and a feedback circuit coupled to said adder to provide a value based on the sum and the analog input signal to said integrating filter, wherein said synchronous sigma-delta modulator has a specific square wave frequency at zero input signal, the square wave frequency at the zero input signal being substantially lower than half an effective sampling frequency at which the plurality of samplers operate.

2. A synchronous sigma-delta modulator as claimed in claim 1, wherein said decision circuit also includes a plurality of delay cells coupled to the plurality of samplers.

3. A synchronous sigma-delta modulator as claimed in claim 2, wherein said decision circuit also includes a phase detector arranged to control a delay of the delay cells.

4. A synchronous sigma-delta modulator as claimed in claim 3, wherein the delay is inversely proportional to a number of samplers.

5. A synchronous sigma-delta modulator for an analog input signal comprising:

an integrating filter;

a decision circuit including a plurality of samplers capable of providing phase shifted output pulses, wherein said decision circuit is arranged to compare a signal from said integrating filter with a reference level and to generate the phase shifted output pulses dependent on a comparison result at synchronously clocked instants;

an adder coupled to said decision circuit to determine a sum of the phase shifted output pulses; and a feedback circuit coupled to said adder to provide a value based on the sum and the analog input signal to said integrating filter, wherein a width of the phase shifted output pulses, supplied to said adder, is approximately one half of a period of these pulses.

6. A synchronous sigma-delta modulator as claimed in claim 5, wherein said decision circuit also includes a plurality of delay cells coupled to the plurality of samplers.

7. A synchronous sigma-delta modulator as claimed in claim 6, wherein said decision circuit also includes a phase detector arranged to control a delay of the delay cells.

8. A synchronous sigma-delta modulator as claimed in claim 7, wherein the delay is inversely proportional to a number of samplers.

* * * * *